United States Patent
Kato et al.

(10) Patent No.: US 6,212,789 B1
(45) Date of Patent: Apr. 10, 2001

(54) SEMICONDUCTOR DEVICE MANUFACTURING SYSTEM

(75) Inventors: Toshio Kato; Noboru Tokumasu; Takayoshi Azumi, all of Tokyo (JP)

(73) Assignees: Canon Sales Co., Inc.; Semiconductor Process Laboratory Co., Ltd., both of (JP)

(*) Notice: Subject to any disclaimer, the term of this patent is extended or adjusted under 35 U.S.C. 154(b) by 0 days.

(21) Appl. No.: 09/132,057

(22) Filed: Aug. 11, 1998

(30) Foreign Application Priority Data

Jun. 19, 1998 (JP) .................................. 10-173045

(51) Int. Cl.[7] .................................. F26B 21/06
(52) U.S. Cl. .................................. 34/77; 34/78; 134/902
(58) Field of Search .................................. 34/73, 75, 76, 34/77, 78, 80; 118/715, 723 CB, 723 EB; 134/902

(56) References Cited

U.S. PATENT DOCUMENTS

| 5,369,891 | * | 12/1994 | Kamikawa | 34/78 |
| 5,443,540 | * | 8/1995 | Kamikawa | 34/73 X |
| 5,608,974 | * | 3/1997 | Tanaka et al. | 34/78 |
| 5,693,149 | | 12/1997 | Passer et al. | |
| 5,956,859 | * | 9/1999 | Matsumoto et al. | 34/74 |
| 5,985,041 | * | 11/1999 | Florez | 34/78 X |
| 6,021,791 | * | 2/2000 | Dryer et al. | 134/902 X |

FOREIGN PATENT DOCUMENTS

| 63-94627 | 4/1988 | (JP) . |
| 3-284842 | 12/1991 | (JP) . |
| 4-348029 | 12/1992 | (JP) . |
| 5-217987 | 8/1993 | (JP) . |
| 6-132271 | 5/1994 | (JP) . |
| 6-140379 | 5/1994 | (JP) . |
| 6-196469 | 7/1994 | (JP) . |
| 7-169730 | 7/1995 | (JP) . |
| 7-283189 | 10/1995 | (JP) . |

OTHER PUBLICATIONS

Semiconductor International, Sep. 1996, "Removing Photoresist Without Plasmas or Liquid Strippers".

* cited by examiner

Primary Examiner—Stephen Gravini
(74) Attorney, Agent, or Firm—Lorusso & Loud (57) ABSTRACT

There is provided a semiconductor device manufacturing system capable of carrying out resist stripping or surface pre-treatment of a substrate by use of a gas such as chlorosulfuric acid with high reactivity The manufacturing system comprises a process vessel 101 formed integrally of a process chamber 1 for treating respective surfaces of substrates 202 with a chemical vapor and a chemical storage chamber 2 for storing chemical for generating the chemical vapor, and a chemical heating means 5 for heating the chemicals stored in the chemical storage chamber 2 to evaporation.

17 Claims, 10 Drawing Sheets

SEMICONDUCTOR DEVICE MANUFACTURING SYSTEM

BACKGROUND OF THE INVENTION

1. Field of the Invention

The present invention relates to a semiconductor device manufacturing system capable of carrying out resist stripping or surface pre-treatment of substrates by use of a gas such as chlorosulfuric acid with higher reactivity.

2. Description of the Prior Art

In recent years, in semiconductor device manufacture. a photoresist film (referred to simply as a "resist film" hereinafter) has been commonly used as a mask for ion implantation or a mask for dry etching.

In the resist film formed via such process, there has been contained an ion-implantation element such as arsenic (As), phosphorus (P), boron (B), or the like, or an inorganic element such as aluminum (Al), titanium (Ti). or the like which is used as electrode material to be patterned. As a result, a complex compound is formed as a reaction product of the above element with the material of the resist film.

Such resist film is not easily removed by the conventional resist film removing methods employing oxygen plasma, ozone, etc. and, therefore, complicated processing has been needed.

In addition, recently a resist film removing method using sulfuric anhydride ($SO_3$) has been disclosed in "52/ Semiconductor International, September 1996", "Monthly Semiconductor World 1996, 11", However, in the resist film removing method using sulfuric anhydride ($SO_3$), in many cases the resist film containing inorganic elements is not easily removed.

Further, in the prior art, recently a mixed solution using sulfuric acid, hydrochloric acid, ammonia, hydrogen peroxide, etc. has been employed mainly in cleaning the silicon wafer prior to film formation. Such a mixed solution is effective for removal of metal, organics, etc. and thus it can be used as an effective cleaning method.

Meanwhile, in recent years, patterns of the semiconductor have become finer, so that the opening of the trench has been made narrow and also the ratio of the depth to the opening width (this ratio is called an aspect ratio) has been increased to as large as 5 to 8.

In the case of such a deep trench having a narrow opening, in the above chemical processing, it has been difficult for the chemicals to enter into the bottom of the trench, and it has also become difficult to remove the chemicals with a pure water wash once the chemicals have entered to the bottom. Accordingly, it has become extremely difficult to completely clean the bottom and the side walls of the trench.

Further, in the case where an insulating film is formed by the CVD method to cover wirings after the surface treatment, the insulating film has been difficult to deposit on the concave portions between the wirings and thus sometimes deep hollow portions have been formed in the centers of the concave portions. As a result, another problem has developed that, when a conductive film used as the wirings is formed on the insulating film, such conductive film cannot be deposited satisfactorily on such hollow portions and such conductive film within such hollow portions cannot be removed.

For example, when chemicals such as EKC (product name, available from the EKC corporation) are employed in resist stripping, and when the film is formed by the CVD method after the conventional pre-treatment for film formation, the growth rate of the $SiO_2$ film is extremely low on such hollow portions, so that the hollow portions are not perfectly buried. The reason for this, though not clearly analyzed, is supposed to be that EKC cannot be completely removed from the surface of the underling insulating film and remains thereon and then residual EKC exerts an unfavorable influence upon the growth rate of the $SiO_2$ film.

Furthermore, in the case where a film is formed on the insulating film, e.g., silicon thermal oxide film on the semiconductor substrate by thermal CVD method using a reaction gas containing TEOS (tetraethylorthosilicate), there has arisen still another problem in that the rate of film formation becomes extremely low on the insulating film as compared with the case where the film is formed directly on the silicon substrate.

Moreover, the amount chemical consumption has increased more and more as the diameter of the wafer is enlarged from 200 mm to 300 mm. As a result, not only has the cost of production risen, but also it takes enormous time and labor to process the waste fluid. In addition, there is another problem of environmental protection.

In order to overcome the above problems, a technique for the surface treatment using vapor of sulfuric acid, hydrochloric acid, or chlorosulfuric acid has been proposed.

Use of a vapor enables the treatment of narrower recess portions. Since vapor, especially vapor of chlorosulfuric acid, also has very strong reactivity, the resist film stripping and the surface pre-treatment of the substrate on which the films are formed can be performed more completely.

However, the chlorosulfuric acid reacts strongly with water to generate sulfuric acid and hydrochloric acid by hydrolysis. Hence, if the chlorosulfuric acid reacts with moisture in transport of the process gas, to generate sulfuric acid and hydrochloric acid, chlorosulfuric acid at a predetermined concentration cannot be introduced into the process chamber, so that there is a possibility that the desired process cannot be performed.

In addition, if such acid adheres to the surface of the substrate, unevenness is caused in processing. Therefore, after the process using the vapor of chlorosulfuric acid, etc. has been conducted, residue of the chlorosulfuric acid, the sulfuric acid and the hydrochloric acid must be removed by cleaning the inside of the process chamber prior to a succeeding process.

Because the vapor of the chlorosulfuric acid, etc. is difficult to handle, the existing state of the process using vapor of chlorosulfuric acid, etc. is at an experimental level. An apparatus which is suitable for mass production using vapor of chlorosulfuric acid, etc. has not yet been developed.

SUMMARY OF THE INVENTION

It is an object of the present invention to provide a semiconductor device manufacturing system which is suited for mass production, which is capable of removing a resist film which is hard to remove and which allows surface treatment of a substrate using a vapor of chlorosulfuric acid.

It is another object of the present invention to provide a semiconductor device manufacturing system which is capable of preventing uneven processing by removing residual gases and residual products contained in a process chamber at the completion of every process and which is capable of carrying out the surface treatment of the substrate with good reproducibility using a vapor such as that of chlorosulfuric acid.

In the present invention, a process vessel is formed integrally of a process chamber for processing surfaces of substrates by a chemical vapor, and a chemical storage chamber for storing chemicals used to generate the chemical vapor. That is, the process chamber and the chemical storage chamber are provided in the same process vessel. For example, the chemical storage chamber is provided immediately below the process chamber.

As a result, vapor of the chemicals, e.g., sulfuric acid, hydrochloric acid, nitric acid, or chlorosulfuric acid stored in the chemical storage chamber, can be introduced into the process chamber as is, as the chemicals are evaporated. If the chemical storage chamber is provided immediately below the process chamber, the vapor of the chemicals may rise as is. Therefore, there is no need to introduce the chemicals via piping and thus chance of the reaction of the process gas with moisture can be considerably reduced. As a result, the surface treatment can be performed with good reproducibility.

In addition, the vapor of the evaporated chemicals can be uniformly supplied to the surfaces of the substrates by introducing the carrier gas into the process chamber. In this case, the temperature of the carrier gas can be made substantially equal to the temperature of the chemicals by heating the carrier gas introducing pipe. Accordingly, since reduction of the vapor pressure of the chemicals from the set value can be largely eliminated, uneven processing can be prevented and also the surface treatment can be performed with good reproducibility.

Also, because the process chamber and the chemical storage chamber are integrated, the chance of reaction of the process gas with moisture can be extremely reduced, so that concentration of the chemical vapor in the process gas can be stabilized. For this reason, if the process chamber is appropriately wide, a plurality of sheets of wafers can be treated simultaneously. Thus, the processing apparatus is suited for mass production.

An opening/closing means is provided between the process chamber and the chemical storage chamber. A necessary amount of chemical vapor can be supplied to the process chamber by adjusting the time of transfer between the process chamber and the chemical storage chamber by means of the opening/closing means.

Further, since a cleaning liquid discharging means is provided in the process chamber, the cleaning liquid can be discharged into the process chamber after surfaces of the substrates have been treated by the chemical gas.

Thus, the interior of the process chamber can be cleaned by washing away residual gas and residual product after the process has been once conducted prior to the succeeding process. As a result, the liquefied chemical vapor remaining on side walls of the process vessel and the surfaces of the substrates can be removed. Further, a process gas having a constant concentration of the chemical vapor can be supplied every process cycle. Therefore, uneven processing can be prevented and reproducibility of the surface treatment can be improved.

The cleaning liquid discharge means may include an introducing pipe for introducing the cleaning liquid and cleaning liquid dischargers connected to the introducing pipe to discharge the cleaning liquid from a plurality of discharge ports provided in a planar array, or may include the cleaning liquid introducing pipe, and cleaning liquid discharger connected to the introducing pipe to discharge the cleaning liquid radially from a plurality of discharge ports.

In addition, a cleaning liquid inlet port may be provided in the chemical storage chamber with a cleaning liquid discharge port provided the process chamber, or vice versa. In either case, the residual gas and the residual products can be washed away from the chemical storage chamber and the process chamber by passing the cleaning liquid through from the chemical storage chamber to the process chamber.

Moreover, heating means may be provided for heating a pipe for bubbling the carrier gas (first pipe) through the chemicals is provided.

Therefore, where the chemicals must be heated, the temperature of the process gas containing the chemicals can be maintained at the temperature of the heated chemicals since the temperature of the carrier gas and the temperature of the chemicals can be made substantially equal to each other.

Accordingly, since the vapor pressure of the chemicals can be largely maintained at a set value, not only can uneven processing be prevented, but also the surface treatment can be performed with good reproducibility.

DESCRIPTION OF THE PREFERRED EMBODIMENT

Semiconductor device manufacturing systems according to embodiments of the present invention will be explained with reference to the accompanying drawings hereinafter

(1) First Embodiment

Figure 1:
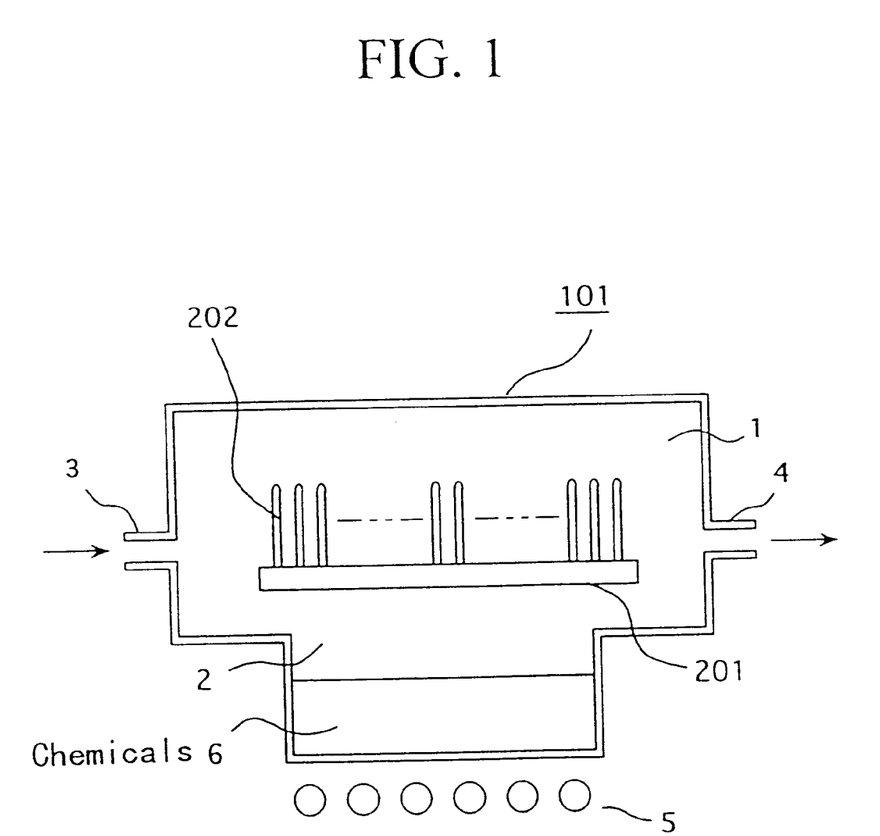
FIG. 1 is a side view showing a configuration of a semiconductor device manufacturing system according to a first embodiment of the present invention.

FIG. 1 is a side view showing a configuration of a semiconductor device manufacturing system according to a first embodiment of the present invention As shown in FIG. 1, a process vessel 101 is partitioned into a process chamber 1, and a chemical storage chamber 2 provided directly below the process chamber 1 and connected to the process chamber 1. The process chamber 1 and the chemical storage chamber 2 are in constant communication with each other. A gas inlet port 3 and a gas exhaust port 4 are provided in the process chamber 1. A gas exhaust apparatus (not shown) is connected to the exhaust port 4.

A chemical heating means 5 for heating the chemicals contained in the chemical storage chamber 2 is provided near the chemical storage chamber 2. As the chemical heating means 5, a resistance heater, an infrared heater, etc may be employed.

If wafers are processed by the processing apparatus, the wafers 202 loaded on a wafer holder 201 are placed in the process chamber 1. A carrier gas, e.g., $N_2$ gas is then introduced from the gas inlet port 3 into the process chamber 1 and simultaneously gas is discharged from the process chamber 1 via the exhaust port 4.

Chemicals 6, e.g., chlorosulfuric acid ($SO_2Cl(OH)$) used to generate the process gas is stored in the chemical storage chamber 2. When the chemicals 6 contained in the chemical storage chamber 2 are heated by the heating means 5 up to a predetermined temperature and vaporized, a chemical vapor then ascends upward into the process chamber 1 so that the wafers 202 are processed. The chemical vapor is then carried by a carrier gas through the process chamber 1 toward the exhaust port 4. At that time, the chemical vapor is uniformly brought into contact with the respective surfaces of the wafers 202 by the carrier gas.

As mentioned above, in the semiconductor device manufacturing system according to the first embodiment, the process chamber 1 and the chemical storage chamber 2, provided directly below and connected with the process chamber 1, are provided in the process vessel 101.

For this reason, the chemicals stored in the chemical storage chamber 2 can rise directly into the process chamber 1 when evaporated. As a result, there is no necessity of introducing the process gas via a pipe and therefore chance of the reaction of the process gas with moisture can be considerably reduced. Thus, reduction in concentration of the chemicals contained in the process gas as well as reduction in vapor pressure of the chemical vapor can be prevented.

Since reduction in concentration of the chemicals contained in the process gas together with reduction in vapor pressure of the chemicals can be prevented, the surfaces of the wafers 202 can be processed with good reproducibility even when the surface treatment is applied to a plurality of wafers 202. As a result, a processing apparatus which is suited for mass production is provided.

Next, a method of removing a resist film by using the above semiconductor device manufacturing system according to the first embodiment will be explained with reference to FIGS. 2A to 2D hereinafter.

In this case, the semiconductor device manufacturing system shown in FIG. 1 is employed as a resist film stripping apparatus, and the wafer holder 201 on which a plurality of wafers are loaded is employed. A vapor of chlorosulfuric acid is employed as the process gas.

Figure 10A:
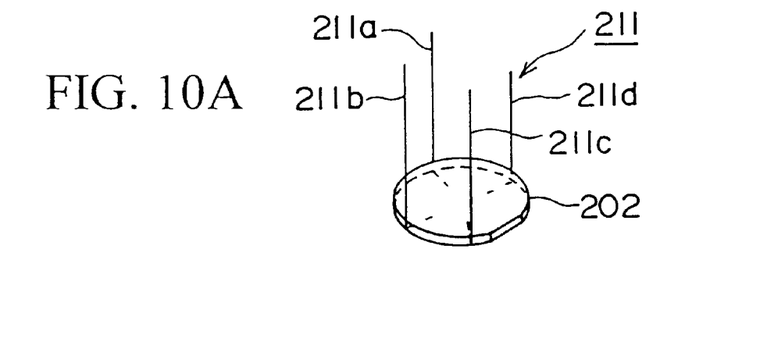
FIG. 10A is a perspective view showing a configuration of a wafer holder which is used in the semiconductor device manufacturing system according to the present invention.
Figure 10B:
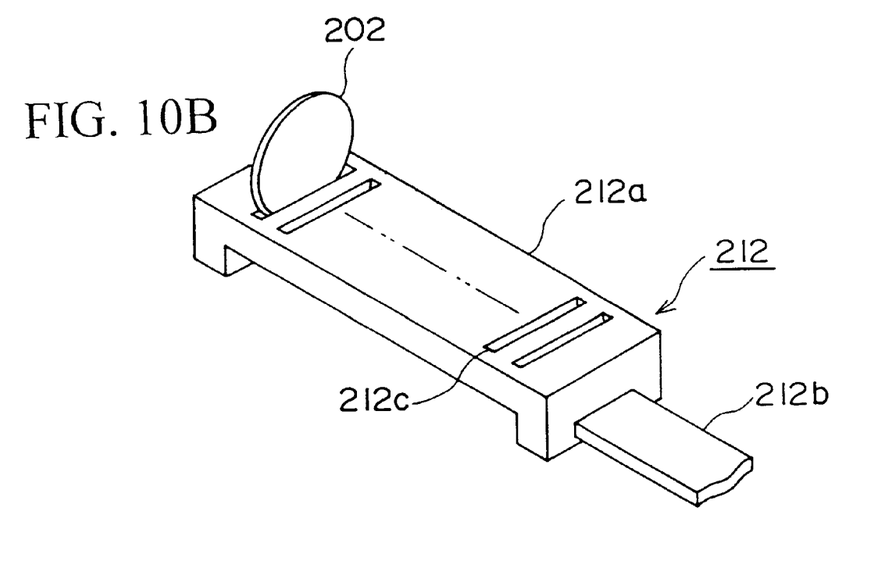
FIG. 10B is a perspective view showing another configuration of the wafer holder which is also used in the semiconductor device manufacturing system according to the present invention.

As an example of the wafer holder 201, there is a substrate holder 212 made of quartz shown in FIG. 10B. Because a number of wafers 202 made of silicon substrates 51 can be loaded on the substrate holder 212, a large number of wafers 202 can be processed simultaneously.

Figure 2A:
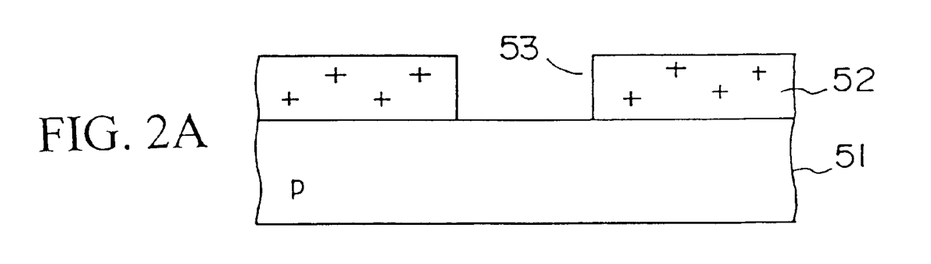
FIGS. 2A to 2D are sectional views illustrating a method of removing a resist film by using the semiconductor device manufacturing system according to the first embodiment of the present invention.

To begin with, the resist is coated on the silicon substrate 51 by spin coating and then hardened by being heated, so that a resist film 52 is formed. In turn, an opening 53 in the resist film 52 is formed for an ion-implanted area on the silicon substrate 51. This state is shown in FIG. 2A.

Figure 2B:
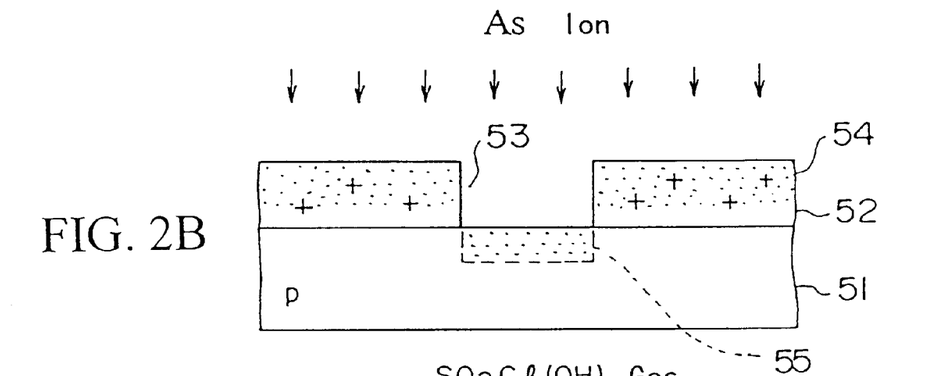

Then, as shown in FIG. 2B, an ion implantation layer 55 is formed by ion-implanting As using the resist film 52 as a mask. In this ion implantation, $AsI_2$ is used as a dopant, a dosage of As is set to $2 \times 10^{15}$ $cm^{-2}$, and an accelerating voltage is set to 50 keV. As is injected into the resist film by the ion implantation and thus a complex compound of As with material of the resist film is generated.

Then, a number of wafers 202 loaded on the substrate holder 212 as shown in FIG. 10B is placed in the process chamber 1 of the process vessel 101. In this step, the wafers 202 are not heated and the temperature of the wafers 202 is kept at room temperature. The wafers 202 can be heated by an infrared heater, etc., as the case may be.

Then, the chlorosulfuric acid stored in the chemical storage chamber 2 is heated to vaporization. Vapor of the chlorosulfuric acid thereby rises into the process chamber 1.

The foregoing step is continued for about thirty minutes until the chlorosulfuric acid has been completely vaporized. After the chlorosulfuric acid has been completely vaporized, the substrate holder 212 is removed from the process chamber 1.

Figure 2C:
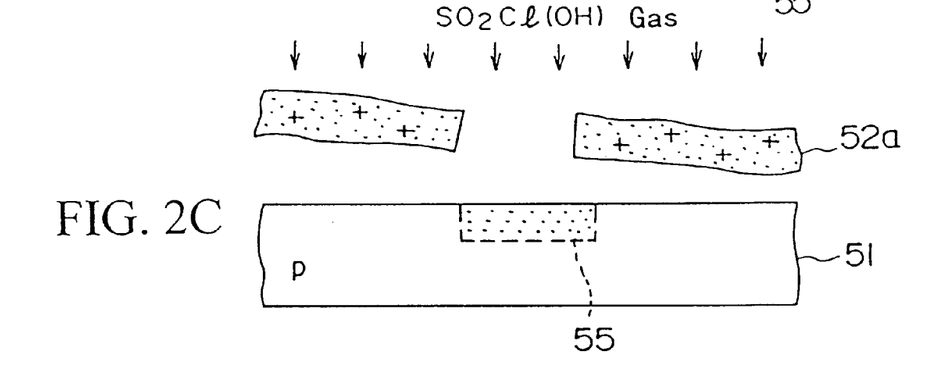

Then, the wafers 202 are rinsed and then dried. During rinsing as shown in FIG. 2C, the remaining resist film 52a can be stripped from the silicon substrate 51.

Figure 2D:
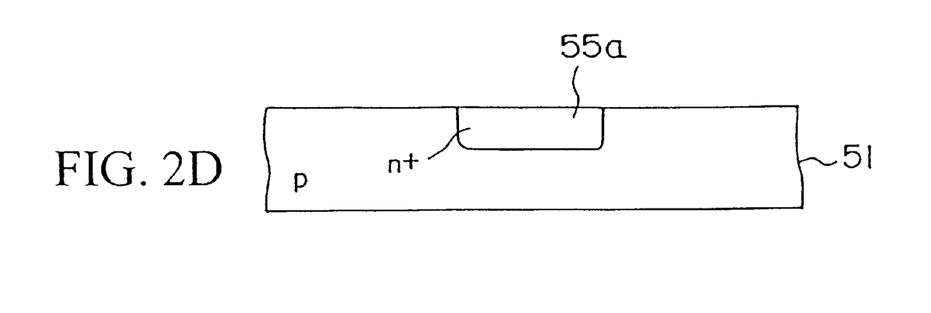

Then, the wafers 202 are annealed in a heat treatment furnace and thus an n-type diffusion layer 55a is formed by activating As in ion-implantation layer 55.

After this, a semiconductor integrated circuit device such as a LSI, or the like can be formed.

As described above, according to the method of removing the resist film by using the semiconductor device manufacturing system according to the first embodiment of the present invention, even though the resist film includes As therein, the resist film 52 can be easily removed from the silicon substrate 51 by using the vapor of the chlorosulfuric acid.

Since the vapor of the chlorosulfuric acid is employed, its handling can be simply performed, and control of the etchant used to remove the resist film can be made easily by adjusting the flow rate, or the like. In addition, a large number of wafers 202 can be processed at a time, thereby enabling mass production of the semiconductor devices.

(2) Second Embodiment

Figure 3:
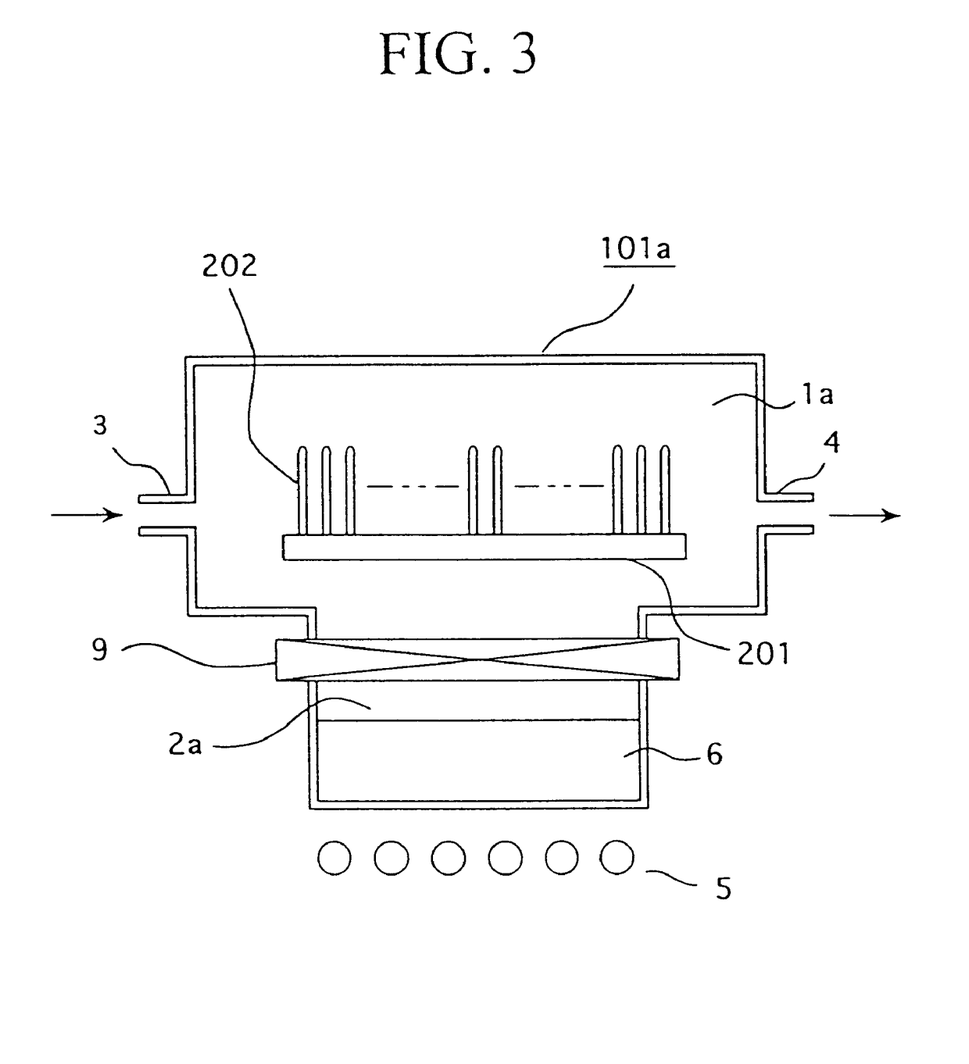
FIG. 3 is a side view showing a configuration of a semiconductor device manufacturing system according to a second embodiment of the present invention.

FIG. 3 is a side view showing a configuration of a semiconductor device manufacturing system according to a second embodiment of the present invention.

As shown in FIG. 3, in the second embodiment of the present invention, a process vessel 101a is partitioned into a process chamber 1a, and a chemical storage chamber 2a connected directly below the process chamber 1a, as in the first embodiment. But this second embodiment is different from the first embodiment in that a valve (opening/closing means) 9 which can connect/disconnect the process chamber 1a to/from the chemical storage chamber 2a is provided between the process chamber 1a and the chemical storage chamber 2a.

The material of the valve (opening/closing means) 9, is a material that is not affected by the chemical or its vapor, for example, Teflon alone or a combination of quartz and Teflon, may be employed. In FIG. 3, parts or elements indicated by the same references as those in FIG. 1 denote the same parts or elements shown in FIG. 1.

As described above, in the semiconductor device manufacturing system according to the second embodiment of the present invention, the opening/closing means 9 is provided between the process chamber 1a and the chemical storage chamber 2a. Therefore, a necessary amount of chemicals stored in the chemical storage chamber 2a can be introduced into the process chamber 1a by opening/closing the valve 9 to carry out the surface treatment.

As in the first embodiment, the chemical storage chamber 2a is provided immediately below the process chamber 1a, and the means 5 for heating the chemicals is provided on the process vessel 101a. As a consequence, the chemical vapor being generated by evaporation can be introduced to the wafers 202 as it is without passing through piping.

Therefore, since the chance of reaction of the process gas with moisture can be reduced, reduction in concentration of the chemicals contained in the process gas as well as reduction in vapor pressure of the chemicals can be prevented. For this reason, the surface of the substrate can be treated with good reproducibility.

Consequently, the semiconductor device manufacturing system according to the third embodiment is suitable for surface treatment of plural wafers 202, so that processing equipment suited for mass production is provided.

(3) Third Embodiment

Figure 4A:
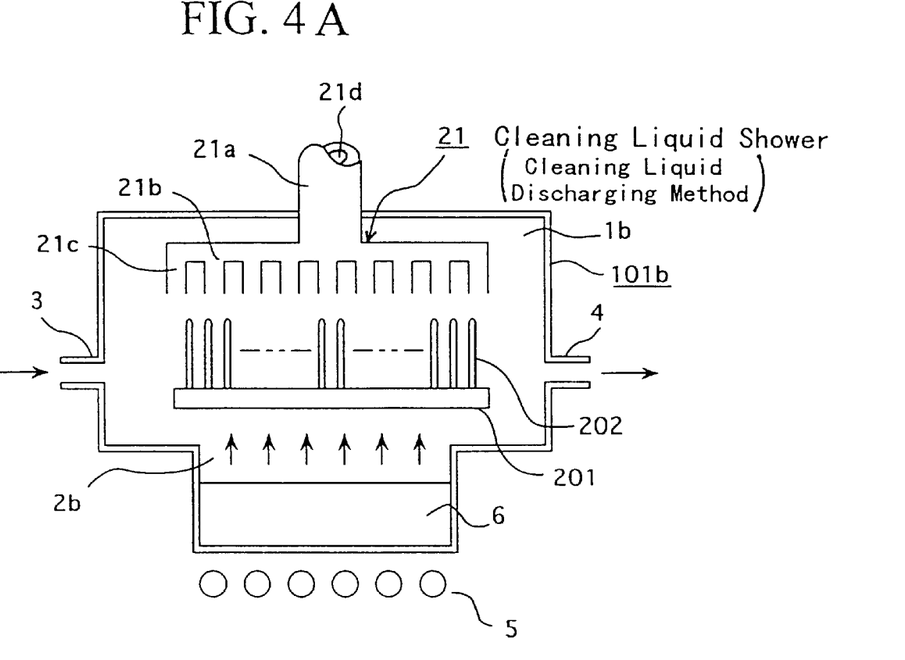
FIGS. 4A and 4B are side views showing a configuration and a manner of using a semiconductor device manufacturing system according to a third embodiment of the present invention.
Figure 4B:
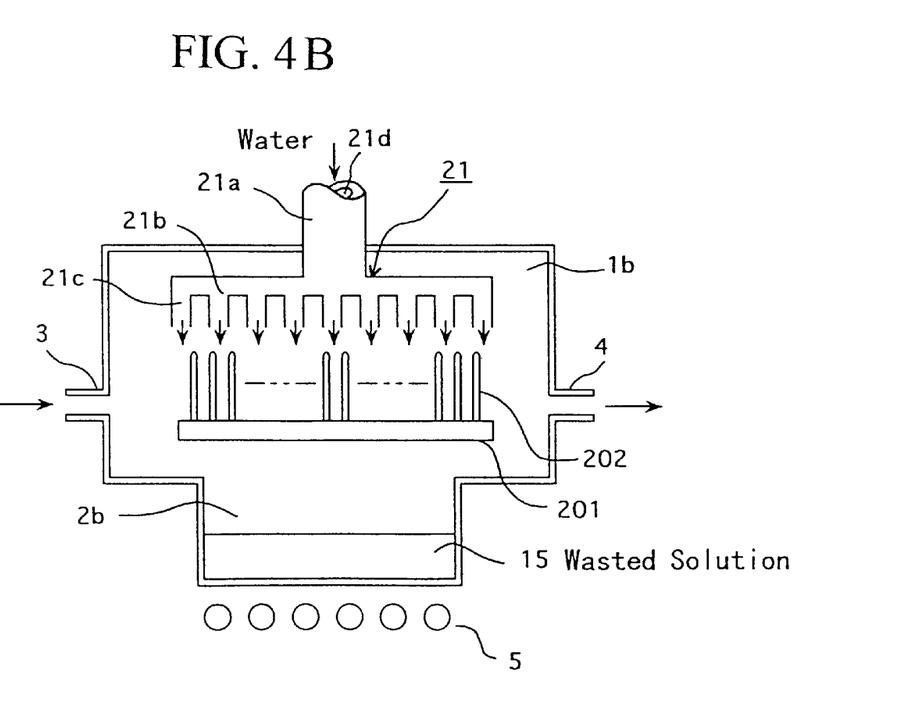

FIGS. 4A and 4B are side views showing a configuration and manner of use of a semiconductor device manufacturing system according to a third embodiment of the present invention.

As shown in FIG. 4A, in the third embodiment, a process vessel 101b is partitioned into a process chamber 1b, and a chemical storage chamber 2b connected immediately below the process chamber 1b, like the first embodiment. However, unlike the first embodiment, a cleaning liquid shower (cleaning liquid discharging means) 21 for discharging a cleaning liquid into the process chamber 1b from a flat plane is provided.

The cleaning liquid shower 21 comprises an introducing pipe 21a in which a flow path 21d for the cleaning liquid is formed, and a cleaning liquid discharging means 21b connected to the introducing pipe 21a, for discharging the cleaning liquid through cleaning liquid discharging ports 21c distributed within the same flat plane.

In FIGS. 4A and 4B, parts or elements indicated by the same reference numerals as those in FIG. 1 denote the same parts or elements shown in FIG. 1.

As explained above, in the semiconductor device manufacturing system according to the third embodiment of the present invention, since the cleaning liquid discharging means 21 is provided in the process chamber 1b, the cleaning liquid can be discharged or emitted into the process chamber 1b after the surface treatment by means of the chemical vapor.

For this reason, the interior of the process chamber 1b can be cleaned by rinsing out the residual gas and the residual product after the wafer cleaning step has been conducted once but prior to succeeding process steps. As a result, because the surface treatment can be conducted under the same conditions for every batch, uneven processing can be prevented and thus the surface treatment can be performed with good reproducibility.

As in the first embodiment, the process chamber 1b, the chemical storage chamber 2b provided immediately below and connected to the process chamber 1b, and the means 5 for heating the chemicals are provided in the process vessel 101b. Consequently, the chemical vapor being generated by evaporation can be introduced to the wafers 202 as it is without passing through piping. Hence, the chance of reaction of the process gas with moisture can be sharply reduced.

Therefore, reduction in concentration of the chemicals contained in the process gas as well as reduction in vapor pressure of the chemicals can be prevented, and also surface treatment of the wafers 202 can be carried out with good reproducibility. For this reason, the semiconductor device manufacturing system which is suited for mass production can be provided.

Subsequently, a method of performing pre-treatment before film formation by using the semiconductor device manufacturing system in FIG. 4A will be explained with reference to FIGS. 5A to 5D hereinafter.

FIGS. 5A to 5D are sectional views illustrating process procedures in their order. A vapor of chlorosulfuric acid is employed as the process gas.

Figure 5A:
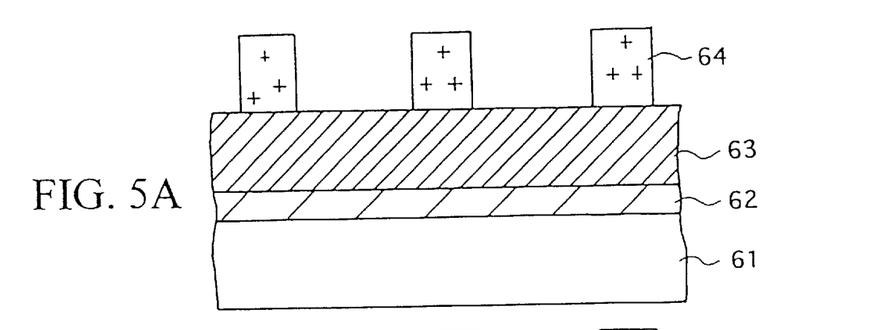
FIGS. 5A to 5D are sectional views illustrating a method of pre-treatment prior to film formation by using the semiconductor device manufacturing system according to the third embodiment of the present invention.

FIG. 5A is a sectional view showing the state before wiring is formed on the substrate. In FIG. 5A, 61 denotes a silicon substrate (semiconductor substrate); 62, a silicon oxide film (underlying insulating film) formed by thermal oxidation; 63, a conductive film made of aluminum of 800 nm in thickness and formed on the silicon oxide film 62; and 64, a resist film formed on the conductive film 63 to be left in designated areas on which the wiring is to be formed.

Figure 5B:
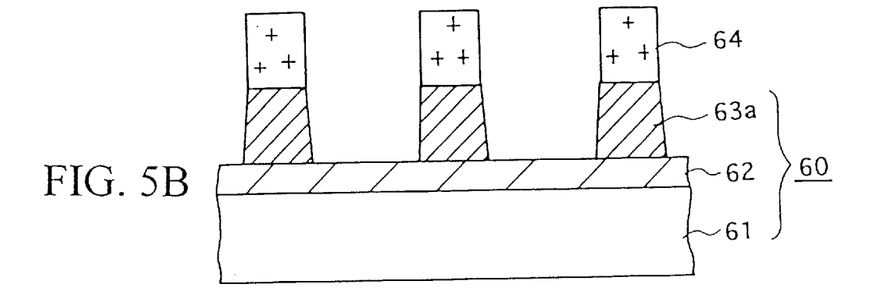

First, as shown in FIG. 5B, a plurality of conductors 63a are formed by etching the conductive film 63 using the resist film 64 as a mask. The width of the conductor 63a is 0.5 $\mu$m and the interval between adjacent wirings 63a is 1 $\mu$m. With the above, a substrate 60 can be formed.

Figure 5C:
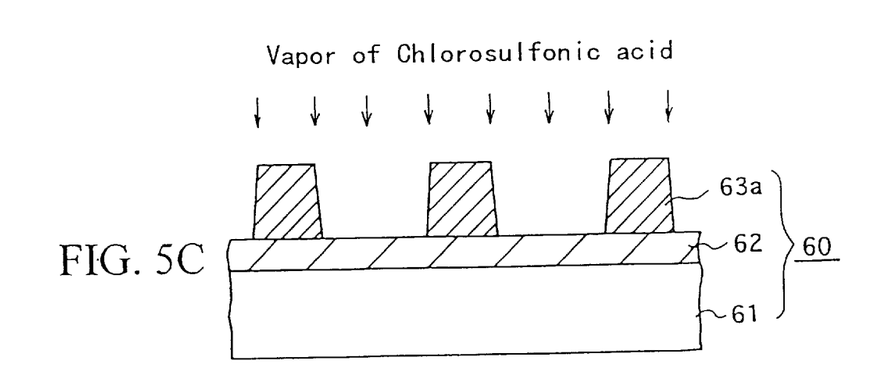

Then, as shown in FIG. 5C, a chlorosulfuric acid liquid 6 is stored in the chemical storage chamber 2b. The wafers 202 loaded on the substrate holder 201 are placed in the process chamber 1b Then, the chlorosulfuric acid liquid 6 stored in the chemical storage chamber 2b is heated to a temperature in the range of 50 to 160° C. so as to evaporate the chlorosulfuric acid. Thus, a chlorosulfuric acid vapor can be generated. At that time, the carrier gas is introduced from the gas inlet port 3 into the process chamber 1b. Thus, the chlorosulfuric acid vapor rises into the process chamber 1b, and then is carried through the process chamber 1b by the carrier gas. Respective surfaces of the substrates 60 can be cleaned and the used process gas can be discharged from the gas exhaust port 4.

The process is continued until the chlorosulfuric acid liquid 6 stored in the chemical storage chamber 2b has been evaporated completely.

After the process has been completed, the cleaning liquid (i.e., water) is supplied to the cleaning liquid discharging means 21 and then discharged into the process chamber 1b therefrom. Thereby, residual process chemicals adhering to the substrate holder 201, the wafers 202, and inner walls of the process chamber 1b can be dissolved into the water and then washed away. Hence, an interior of the process chamber 1b can be cleaned.

In this case, even if sulfuric acid, hydrochloric acid, etc. is generated as a waste solution 15 and then stored in the chemical storage chamber 2b, it can be discharged via an exhaust port (not shown) provided in the chemical storage chamber 2b.

Then, the wafers 202 are unloaded from the process chamber 1b and loaded into film forming equipment (not shown).

Figure 5D:
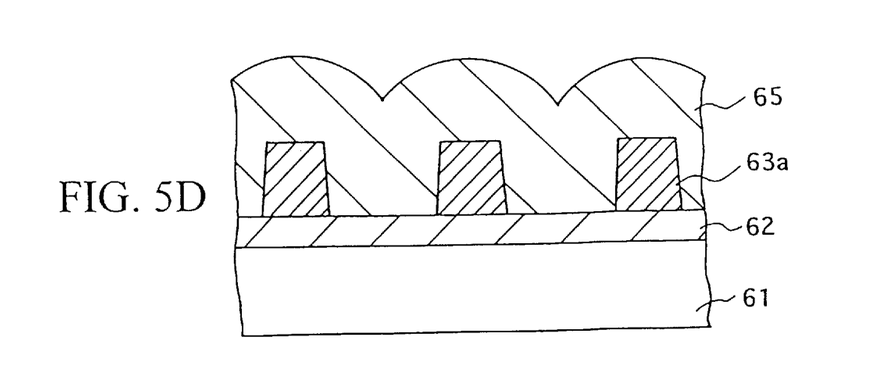

In turn, as shown in FIG. 5D, a silicon oxide film (insulating film) 65 for covering the wiring 63a is formed by the thermal CVD method using the following reaction gas under the conditions given in the following.

TABLE 1

| Conditions of the reaction gas | |
| --- | --- |
| Flow rate of TEOS | 1 SCCM |
| Mass of $O_3$ in $O_2$ of $lm^3$ | 120 g |
| Flow rate of $O_3 + O_2$ | 7.5 SCCM |
| Flow rate of $N_2$ (carrier gas) | 18 SCCM |
| Film forming temperature | 450° C. |

With the above, the conductive film serving as an upper wiring layer can be formed normally in the hollow portions which are formed on the surface of the insulating film 65. In addition, since the hollow portions can be made shallow, the conductive film can be cleanly removed from the bottom areas of the hollow portions when the conductive film being formed once is patterned by etching.

(4) Fourth Embodiment

Figure 6A:
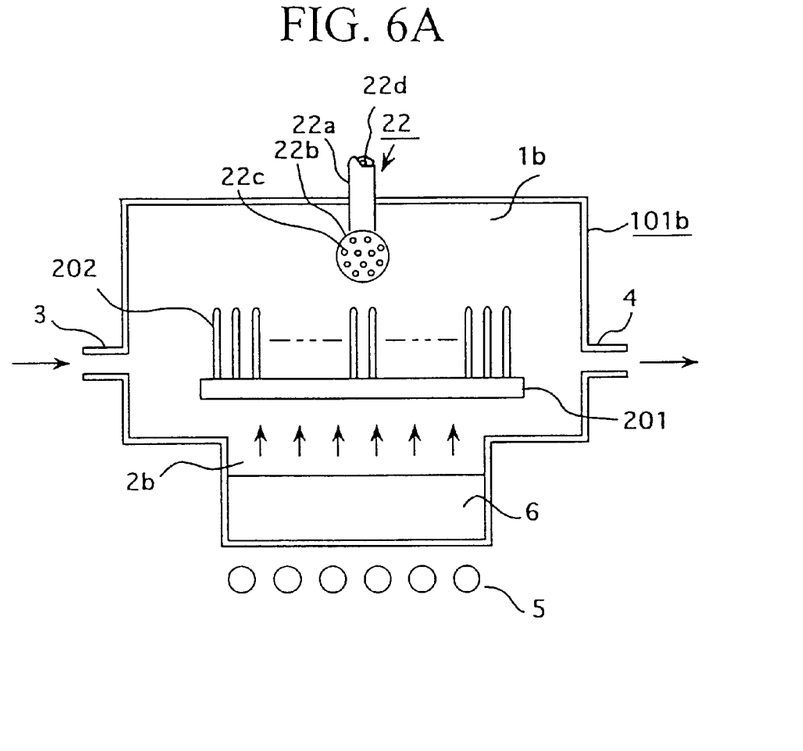
FIGS. 6A and 6B are side views showing a configuration and a manner of using a semiconductor device manufacturing system according to a fourth embodiment of the present invention.
Figure 6B:
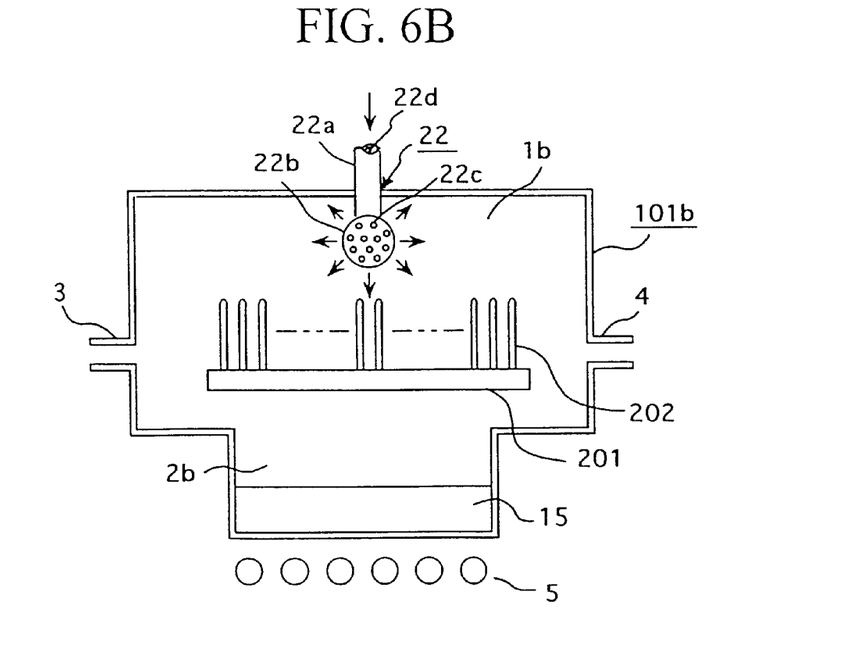

FIGS. 6A and 6B are side views showing a configuration of a semiconductor device manufacturing system according to a fourth embodiment of the present invention.

A difference between this semiconductor device manufacturing system according to this fourth embodiment and the semiconductor device manufacturing system according to the third embodiment shown in FIG. 4 resides in the different cleaning liquid discharging means 22, especially a cleaning liquid discharging portion 22b. More particularly, the cleaning liquid discharging portion 22b connected to a cleaning liquid introducing pipe 22a is formed as a hollow sphere in which a plurality of cleaning liquid discharging ports 22c are formed. The cleaning liquid can be discharged radially from the cleaning liquid discharging ports 22c into the process chamber 1b.

In this fourth embodiment, since a cleaning liquid discharging means 22 is provided as in the third embodiment of the present invention, the process chemical which adheres to the inner walls of the process chamber 1b, etc. after the process, for example, the residual chemical such as the chlorosulfuric acid, or the sulfuric acid or hydrochloric acid generated as a reaction product, can be removed, so that the interior of the process chamber 1b can be cleaned.

As a result, the uneven processing can be prevented and also the surfaces of the substrates 202 can be treated by using the process gas with good reproducibility.

(5) Fifth Embodiment

Figure 7A:
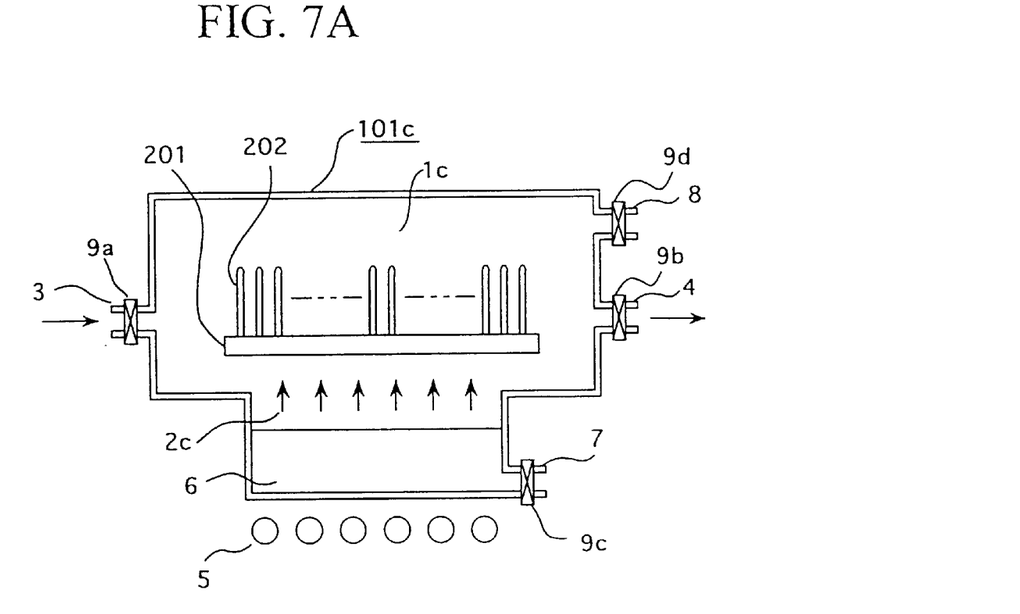
FIGS. 7A and 7B are side views showing a configuration and a manner of using a semiconductor device manufacturing system according to a fifth embodiment of the present invention.
Figure 7B:
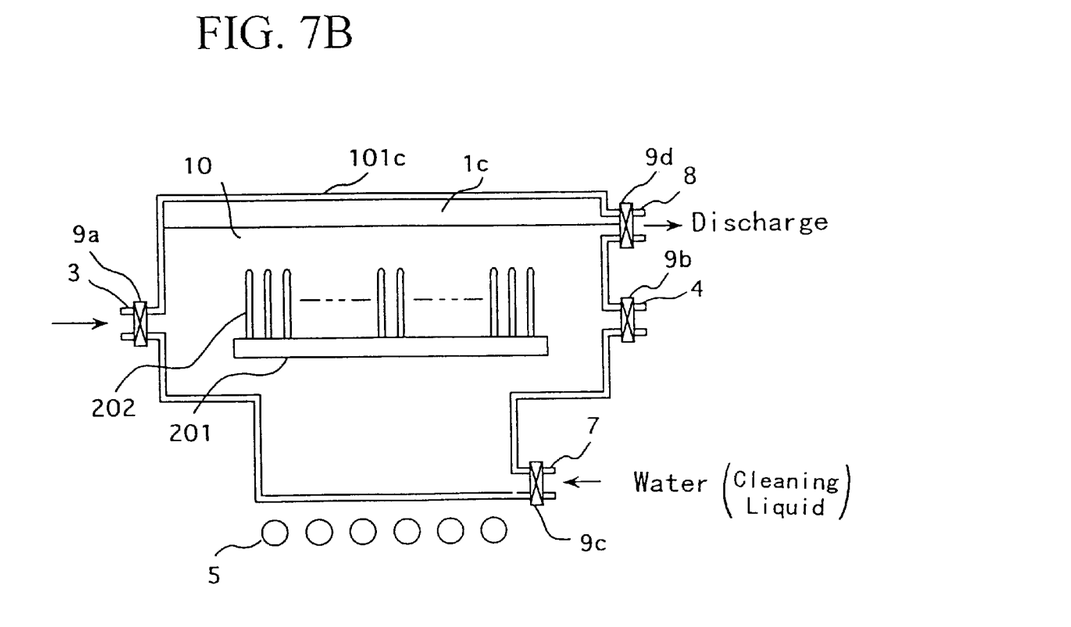

FIGS. 7A and 7B are side views showing a configuration of a semiconductor device manufacturing system according to a fifth embodiment of the present invention.

As shown in FIG. 7A, this semiconductor device manufacturing system according to this fifth embodiment is similar to the first embodiment in that a process vessel 101c is partitioned into a process chamber 1c, and a chemical storage chamber 2c connected immediately below the process chamber 1c. But this semiconductor device manufacturing system is different from the first embodiment in that a cleaning liquid inlet port 7 is connected to the chemical storage chamber 2c and also a cleaning liquid discharge port 8 is provided in the process chamber 1c.

In addition, this semiconductor device manufacturing system is different from the first embodiment in that valves 9a to 9d for opening flow paths of the process gas and the cleaning liquid and cutting them off are provided in the gas inlet port 3, the cleaning liquid inlet port 7, the gas exhaust port 4, and the cleaning liquid discharge port 8, respectively.

According to the fifth embodiment described above, as shown in FIG. 7A, after the surfaces of the wafers 202 are treated by evaporating the chemicals 6 stored in the chemical storage chamber 2c completely, the interior of the process chamber 1c can be cleaned by introducing the cleaning liquid (water) from the cleaning liquid inlet port 7 and then discharging the cleaning liquid from the cleaning liquid discharge port 8, as shown in FIG. 7B. In this event, since the cleaning liquid can be passed through from the chemical storage chamber 2c to the process chamber 1c, the residual gas and the residual products remaining in the chemical storage chamber 2c and the process chamber 1c can be washed away. As a consequence, the insides of the chemical storage chamber 2c and the process chamber 1c can be cleaned.

(6) Sixth Embodiment

Figure 8:
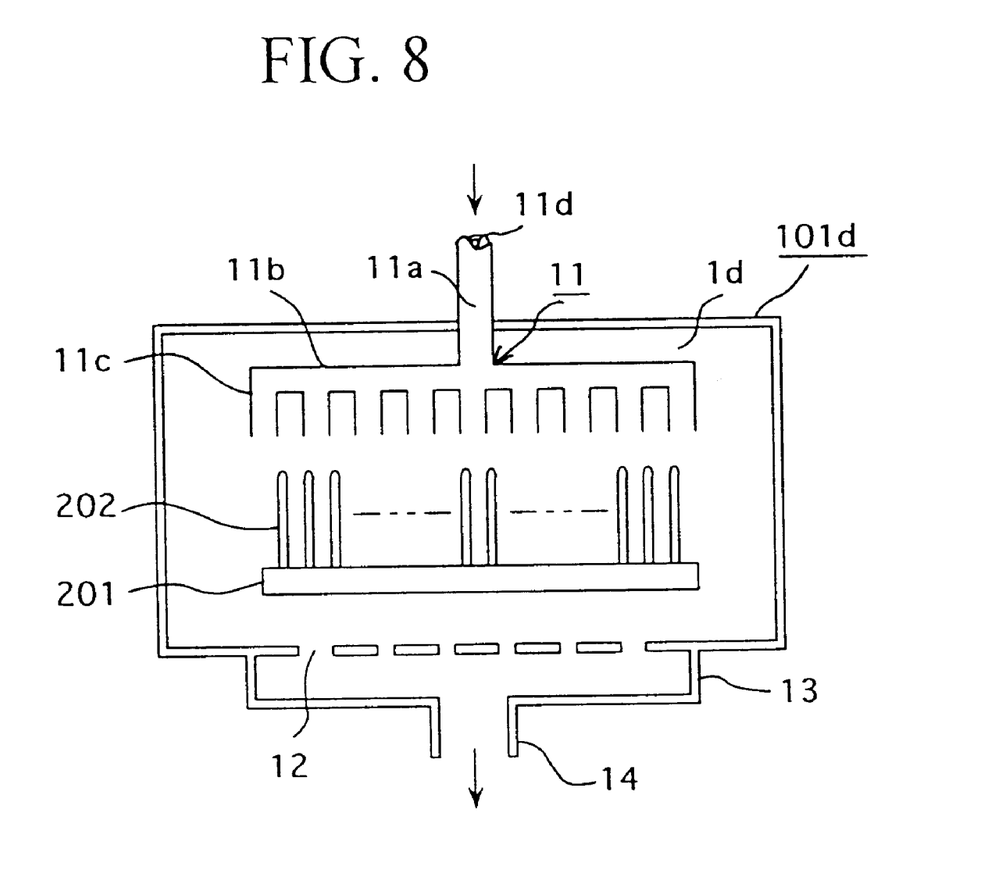
FIG. 8 is a side view showing a configuration of a semiconductor device manufacturing system according to a sixth embodiment of the present invention.

FIG. 8 is a side view showing a configuration of a semiconductor device manufacturing system according to a sixth embodiment of the present invention.

As shown in FIG. 8, the sixth embodiment of the present invention is different from the first embodiment in the following points.

That is, the process vessel 101d consists of only a process chamber 1d since it does not have a chemical storage chamber. The process gas can be discharged from a process gas discharging means 11 into the process chamber 1d. The process gas discharging means 11 is provided positioned over the wafers 202 when the wafers (substrates) 202 are loaded in the process chamber 1d.

The process gas discharging means 11 comprises a process gas inlet pipe 11a in which a process gas flow path 11d is formed, and a process gas discharger 11b connected to the process gas inlet pipe 11a, for discharging the process gas from its gas discharge ports 11c which are distributed in a flat plane. The process gas inlet pipe 11a is also heated to a predetermined temperature by a heating means (not shown).

Gas exhaust holes 12 are provided in a bottom wall of the process chamber 1d. An exhaust gas header 13 which receives the gas exiting via the gas flowout holes 12 is connected to the bottom wall of the process chamber 1d. A gas exhaust port 14 to which an exhaust apparatus (not shown) is connected is provided in the exhaust gas header 13. Accordingly, the spent gas contained in the process vessel 101d can be removed from the process vessel 101d.

If the processed wafers 202 are held upright, the process gas can be passed smoothly through the process vessel 101d since the process gas is supplied from the bottom to the top of the process vessel 101d.

If the process gas inlet pipe 11a is preheated such that the vapor pressure of the process gas coincides with a set value, the surfaces of the wafers 202 can be constantly exposed to the process gas at a constant vapor pressure. As a result, reproducibility of the process is improved.

(7) Seventh Embodiment

Figure 9:
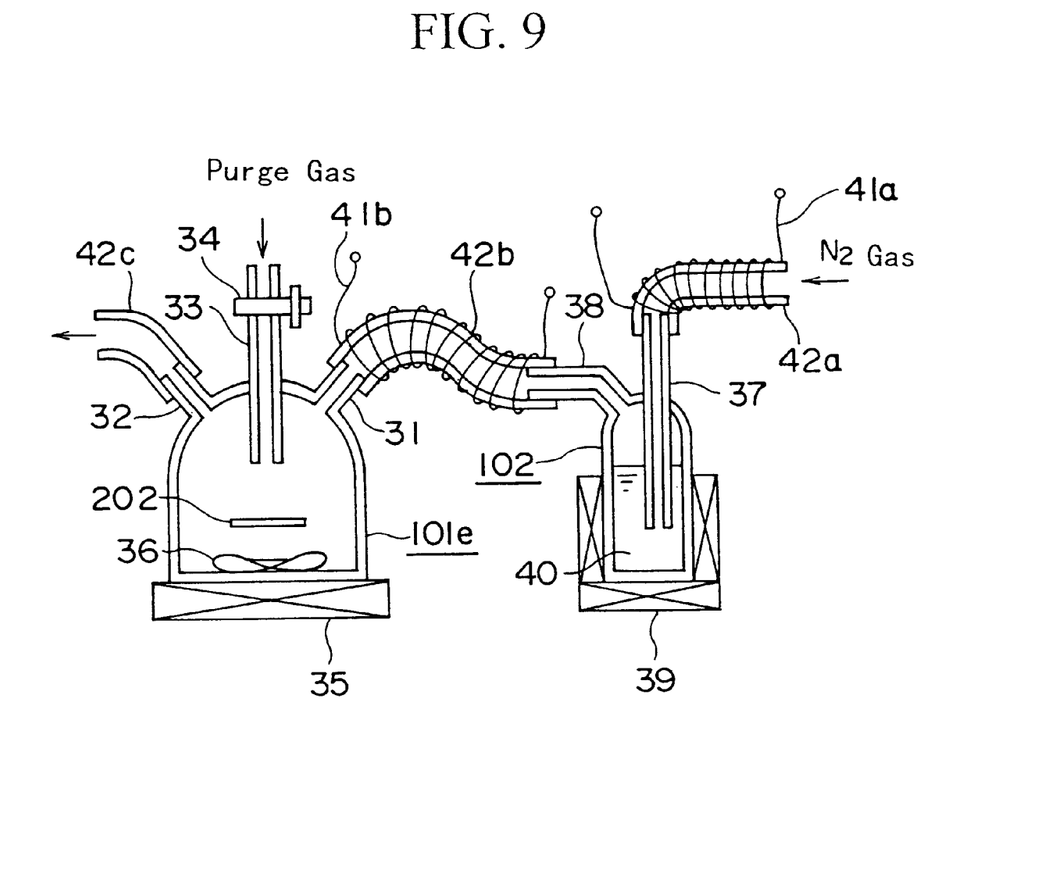
FIG. 9 is a side view showing a configuration of a semiconductor device manufacturing system according to a seventh embodiment of the present invention.

FIG. 9 is a side view showing a configuration of a semiconductor device manufacturing system according to a seventh embodiment of the present invention.

The seventh embodiment of the present invention is different from the first to sixth embodiments in the following particulars.

As shown in FIG. 9, the semiconductor device manufacturing system according to the seventh embodiment of the present invention comprises a process vessel 101e having a process chamber in which wafers (substrates) 202 are loaded to treat the surfaces of the wafers 202 with the process gas, a chemical storage tank 102 for storing or reserving chemicals 40, and a chemical heating means 39 provided around the chemical storage tank 102. A resistance heater, an infrared heater, etc. may be employed as the chemicals heating means 39.

The process vessel 101e has a process gas inlet port 31 and a process gas exhaust port 32, and also has a purge gas inlet port 33 for introducing a purge gas to purge the residual gas after the process has been terminated. Flow of the purge gas is cut off by a valve 34 during the process. Also, the process vessel 101e has a heating means 35 for heating the wafers 202. A rotating magnet is provided adjacent the heating means 35.

An inlet pipe (first pipe) 37 serves to introduce the carrier gas, e.g. $N_2$ gas into the chemicals 40 stored in the chemical storage tank 102. A first pipe 42a is connected to this inlet pipe 37. A heating means 41a heats the carrier gas flowing through the first pipe 42a.

When the chemicals 40 are heated, the carrier gas is also heated up to the same temperature as the chemicals 40. The carrier gas is passed through the chemicals 40 to generate the process gas by bubbling. In this case, if the carrier gas is preheated, not only can reduction in temperature of the chemicals be prevented, but also fluctuation in the vapor pressure of the chemicals vapor can be prevented.

The chemical storage tank 102 has an exhaust port 38 to which one end of a second pipe 42b is connected. The other end of the second pipe 42b is connected to a gas inlet port 31 of the process vessel 101e. The second pipe 42b can transfer the carrier gas (process gas) containing the vapor of the chemicals 40 from the chemical storage tank 102 to the process vessel 101e. In addition, a heating means 41b heats the process gas passing through the second pipe 42b.

In this case, a resistance heater is employed as the heating means 41a, 41b.

Moreover, a magnetic stirrer (means for stirring the process gas) 36 is provided on the bottom of the process vessel 101e. The magnetic stirrer 36 can be rotated by turning the magnet 35 provided on the outside of the process vessel 101e to thus stir the process gas contained in the process vessel 101e.

According to the above seventh embodiment, there is provided the heating means 41a which can heat the pipes (first pipes) 37, 42a for introducing the carrier gas which generates the process gas by bubbling through the chemicals.

Therefore, since the temperature of the carrier gas and the temperature of the chemicals can be made substantially equal to each other, the temperature of the process gas containing the chemicals can be maintained at a given temperature.

For this reason, a sharp reduction of the vapor pressure of the chemicals from the set value can be prevented. Hence, uneven processing can be prevented and also the surface treatment can be conducted with good reproducibility.

Further, since the process gas can be stirred by the magnetic stirrer 36, the process gas can be supplied more uniformly onto the surfaces of the wafers 202.

(8) Explanation of a Substrate Holder Used in the Processing System According to the Above Embodiments.

Figure 10C:
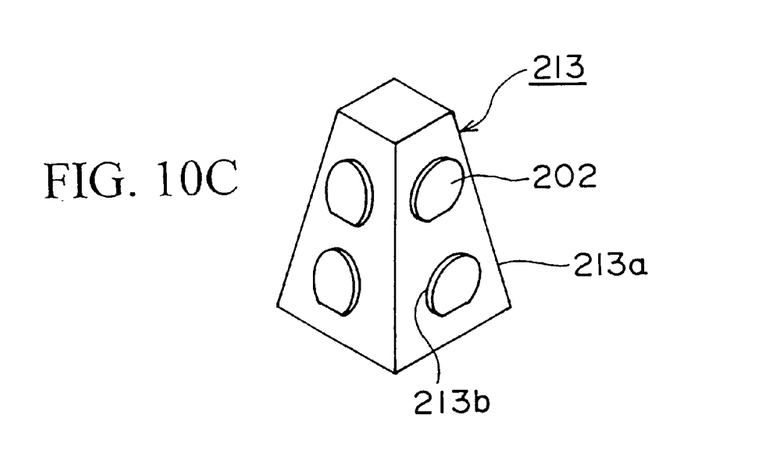
FIG. 10C is a perspective view showing still another configuration of the wafer holder which is used in the semiconductor device manufacturing system according to the present invention.

FIGS. 10A to 10C are perspective views each showing a configuration of a wafer holder which is used in the semiconductor device manufacturing system according to the present invention.

(i) First Example

As shown in FIG. 10A, the wafer holder 211 consists of a set of four resilient fine wires, each with a top end formed like a hook. Top end portions of the wafer holding portions are forced outward when the wafer 202 is attached/detached to/from the wafer holder 211, so that the wafer can be held or released by the spring force of the hooked wafer holding portions.

This wafer holder 211 is suitable for the case where the number of the processed wafers is small.

(ii) Second Example

As shown in FIG. 10B, grooves 212c for holding the wafers 202 are formed in a quartz plate 212a. The wafer holder 212 can be clamped at portion 212b.

Because this wafer holder 212 can hold a number of wafers without a wide area, it is suited for mass production.

Also, since the wafers 202 can held upright, the process gas can be supplied relatively uniformly to the surfaces of the wafers 202 when the process gas is supplied from above.

(iii) Third Example

As shown in FIG. 10C, a wafer holder 213 has the shape of a quadrangular pyramid box. Two recess portions 213b on which the wafers 202 are held are formed vertically on respective pyramidal surfaces 213a. Eight wafers 202 can be held on the four surfaces of this wafer holder 213. In this case, if the process gas is supplied from above, such process gas can be supplied obliquely relative to the surfaces of the wafers 202.

Although the embodiments of the present invention have been discussed in detail as above, the present invention is not limited to the embodiments described above. Modifications or variations within change of design can be included in the technical range of the present invention.

For instance, while chlorosulfuric acid vapor has been employed as the process gas, chemicals such as sulfuric acid, hydrochloric acid, nitric acid and others may be employed.

Furthermore, although the chemical storage chambers 2, 2a to 2c have been provided directly below the process chambers 1, 1a to 1c, respectively, in the above first to fifth embodiments of the present invention, the chemical storage chamber may be provided on the side of the process chamber. The generated chemical vapor can be carried into the process chamber by the carrier gas.

Further, if the introducing pipe connected to the gas inlet port 3 to introduce the carrier gas is heated up to a temperature which is equal to the chemicals heating temperature, the temperature of the chemical vapor is not reduced by the carrier gas introduced into the process chambers 1, 1a to 1c and, therefore, the surfaces of the wafers 202 can constantly be exposed to the process gas at a constant vapor pressure. Thus, reproducibility of the process can be improved.

Moreover, while in the above fifth embodiment, the cleaning liquid inlet port has been provided in the chemical storage chamber 2c and the cleaning liquid discharge port 8 has been provided in the process chamber 1c. The cleaning liquid inlet port may be provided in the process chamber 1c, as well as the discharge port may be provided in the chemical storage chamber 2c.

Also, in the above sixth embodiment, while the gas flowout holes 12 and the gas exhaust port 14 have been provided in the bottom wall of the process chamber 1d, the gas flowout holes 12 and the gas exhaust port 14 may be provided downstream of the wafers 202 to be processed, and need not be in the bottom wall.

Further, while the seventh embodiment includes heating means 41b for heating the second pipe 42b, such heating means 41b for heating the second pipe 42b may be eliminated.

The reason for this is that the process gas itself generated from the chemicals can also be heated up to a predetermined temperature since the carrier gas is heated to about the temperature of the chemicals by the heating means 41a for heating the first pipe 42a, and, therefore, there is no drop in the temperature of the process gas until the process gas enters the process vessel 101e if the second pipe 42b is made short. Accordingly, the heating means 41b for heating the second pipe 42b is advantageous where the second pipe 42b is longer and thus the temperature of the process gas falls before entering the process vessel 101e.

Also, while a resistance heater has been employed as the heating means 41a, 41b, other heating means may be employed.

Further, other stirring means may be employed in place of the magnetic stirrer.

As described above, in the present invention, both the process chamber and the chemical storage chamber are provided in the same process vessel. Hence, the process gas can be supplied directly to the process chamber without passing through piping when the chemical stored in the chemical storage chamber is evaporated and, therefore, the chance of the reaction of the process gas with moisture can be considerably reduced. Therefore, the surfaces of the substrates can be treated with good reproducibility.

Because the concentration of the chemical vapor contained in the process gas can be stabilized by connecting the process chamber and the chemical storage chamber to each other, plural wafers can be treated simultaneously. As a result, the semiconductor device manufacturing system is suited for mass production.

In addition, because an opening/closing means has been provided between the process chamber and the chemical storage chamber only the necessary amount of chemical vapor need be supplied to the process chamber.

In addition, since the cleaning liquid discharging means has been provided in the process chamber, the process gas whose chemical vapor concentration is kept constant can be supplied by cleaning the process chamber every process. As a result, improvement in reproducibility is attained.

Further, because heating means is provided for heating the pipe introducing the carrier gas (first pipe) which generates the process gas by bubbling through the chemicals, where heating of the chemicals is necessary, variation of the vapor pressure of the chemicals can be suppressed by setting the temperature of the carrier gas and the temperature of the chemicals substantially equal. Therefore, not only can uneven processing be prevented but also the surface treatment can be performed with good reproducibility.

What is claimed is:

1. A semiconductor device manufacturing system comprising:

a process vessel containing a process chamber, for the processing of surfaces of substrates by contacting the surfaces with a chemical vapor, and a chemical storage chamber integral with and opening into said process chamber, with an opening between said process chamber and said chemical storage chamber defining a flow path for the chemical vapor from said chemical storage chamber into said process chamber;

opening/closing means, provided between said process chamber and said chemical storage chamber, for movement relative to said opening, between a closed position closing said opening and an open position uncovering said opening and allowing flow of the chemical vapor from said chemical storage chamber into said process chamber; and chemical heating means for heating chemicals contained in said chemical storage chamber to evaporate the chemicals, thereby generating the chemical vapor.

2. A semiconductor device manufacturing system according to claim 1 wherein said chemical storage chamber is provided immediately below said process chamber.

3. A semiconductor device manufacturing system according to claim 1 further comprising a gas inlet port provided in said process vessel for introducing carrier gas into said process chamber, and an exhaust port provided in said process chamber of said process vessel for discharging the chemical vapor and the carrier gas from said process chamber.

4. A semiconductor device manufacturing system according to claim 3 further comprising a carrier gas pipe connected to said gas inlet port and carrier gas heating means for heating said carrier gas pipe and carrier gas within said carrier gas pipe.

5. A semiconductor device manufacturing system comprising:

a process vessel containing a process chamber, for the processing of surfaces of substrates by contacting the surfaces with a chemical vapor, and a chemical storage chamber integral with and opening into said process chamber, with an opening between said chamber and said chemical storage chamber defining a flow path for the chemical vapor from said chemical storage chamber into said process chamber;

chemical heating means for heating chemicals contained in said chemical storage chamber to evaporate the chemicals, thereby generating the chemical vapor; and liquid cleaning means for introducing a cleaning liquid into an interior of said process chamber, thereby cleaning the interior of said process chamber.

6. A semiconductor device manufacturing system according to claim 5 wherein said liquid cleaning means comprises at least one spray head mounted within said process chamber.

7. A semiconductor device manufacturing system according to claim 6 wherein said spray head has a planar array of cleaning liquid discharge ports.

8. A semiconductor device manufacturing system according to claim 6, wherein said spray head is rounded and has a plurality of discharge ports for radially discharging the cleaning liquid.

9. A semiconductor device manufacturing system according to claim 5, wherein said liquid cleaning means comprises a cleaning liquid inlet port in said chemical storage chamber, and a cleaning liquid discharge port in said process chamber, whereby the cleaning liquid can be passed from said chemical storage chamber into and through said process chamber.

10. A semiconductor device manufacturing system according to claim 5 wherein said liquid cleaning means comprises a cleaning liquid inlet port in said process chamber, and a cleaning liquid discharge port in said chemical storage chamber, whereby the cleaning liquid can be passed from said process chamber into and through said chemical storage chamber.

11. A semiconductor device manufacturing system comprising:

a process chamber for containing substrates having surfaces to be treated with a process gas containing a chemical vapor;

a chemical storage chamber for storing chemicals and means for generating the chemical vapor; and process gas discharge means for discharging the process gas containing the generated chemical vapor, said process gas discharge means comprising a gas distributor having a plurality of gas discharging parts arranged in a planar array; and connecting means for connecting said process gas discharge means to said chemical storage chamber and for supplying the process gas from said chemical storage chamber to said process gas discharge means.

12. A semiconductor device manufacturing system according to claim 11, further comprising an exhaust port which is provided in a bottom surface of said process chamber for exhausting the process gas from said process chamber.

13. A semiconductor device manufacturing system according to claim 11, wherein said connecting mans comprises a process gas pipe and a heating means for heating the process gas carried through said process gas pipe.

14. A semiconductor device manufacturing system according to claim 11, further comprising stirring means, provided in said process chamber, for stirring process gas introduced into said process chamber.

15. A semiconductor device manufacturing system according to claim 11, further comprising, stored within said chemical storage chamber, chemicals for generating the chemical vapor, said chemicals including sulfuric acid, hydrochloric acid, or chlorosulfuric acid.

16. A semiconductor device manufacturing system comprising:

a process vessel containing a process chamber for holding substrates with surfaces to be processed by contact with a chemical vapor, a chemical storage chamber integral with and located vertically beneath said process chamber, and a central opening in a bottom wall of said process chamber, said central opening defining a top portion of said chemical storage chamber and a vertical flow path extending vertically from chemicals stored within said chemical storage chamber to the substrates held within said process chamber;

chemical heating means for heating chemicals contained within said chemical storage chamber to thereby generate the chemical vapor, whereby the generated chemical vapor rises vertically through said central opening and vertically into contact from beneath with substrates held within said process chamber; and opening/closing means, provided between said process chamber and said chemical storage chamber, for movement relative to said central opening, between a closed position closing said central opening and an open position uncovering said central opening and allowing flow of the chemical vapor from said chemical storage chamber into said process chamber.

17. A semiconductor device manufacturing system according to claim 16 wherein said process chamber has a diameter larger than that of said chemical storage chamber and wherein said opening is coextensive with the diameter of said chemical storage chamber.

* * * * *